United States Patent
Tinker

(10) Patent No.: US 6,584,162 B1
(45) Date of Patent: Jun. 24, 2003

(54) METHOD AND APPARATUS SAMPLE RATE CONVERSIONS IN AN ANALOG TO DIGITAL CONVERTER

(75) Inventor: Darrell E. Tinker, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 334 days.

(21) Appl. No.: 09/629,067

(22) Filed: Jul. 31, 2000

(51) Int. Cl.[7] .............................. H04L 7/00; H04B 3/46; H04B 17/00; H04Q 1/20; H04J 3/22

(52) U.S. Cl. ........................ 375/355; 375/354; 375/225; 370/545

(58) Field of Search ................................. 375/355, 354, 375/225; 370/545; 341/155

(56) References Cited

U.S. PATENT DOCUMENTS

| | | | |
|---|---|---|---|
| 5,475,628 A | * 12/1995 | Adams et al. ............ | 364/724.1 |
| 5,497,152 A | * 3/1996 | Wilson et al. ................. | 341/61 |
| 5,513,209 A | * 4/1996 | Holm .......................... | 375/354 |
| 5,818,888 A | * 10/1998 | Holmqvist ................... | 375/355 |
| 5,892,468 A | * 4/1999 | Wilson et al. ................. | 341/61 |
| 5,892,694 A | 4/1999 | Ott | |
| 5,907,295 A | * 5/1999 | Lin .............................. | 341/61 |
| 5,963,160 A | * 10/1999 | Wilson et al. ............... | 341/143 |
| 6,208,671 B1 | * 3/2001 | Paulos et al. ................ | 370/545 |

* cited by examiner

*Primary Examiner*—Mohammad H. Ghayour
*Assistant Examiner*—Tony Al-Beshrawi
(74) *Attorney, Agent, or Firm*—Timothy W. Markison

(57) ABSTRACT

A method and apparatus for sample rate conversion in an analog to digital converter. Such a method and apparatus include processing that begins by receiving an input digital stream at a first clock rate from an oversampling quantizer (e.g., a sigma delta modulator). The processing continues by integrating the input digital stream over multiple clock cycles at the first clock rate to produce an integrated digital signal. The processing continues by determining when an interpolated digital value of the integrated digital signal is to be passed to a differentiation stage based on a difference between a sample rate conversion value and a reference value. The processing continues by, when the difference is within a targeted range (e.g., between 0 and −1 or 1 and 0), generating the interpolated digital value based on at least a portion of the difference and an interpolation of integration samples of the integrated digital signal occurring at cycles of the first clock rate that are temporal to when the interpolated digital value is to be passed. The processing further continues by passing the interpolated digital value to the differentiation stage at a converted sample rate.

24 Claims, 3 Drawing Sheets

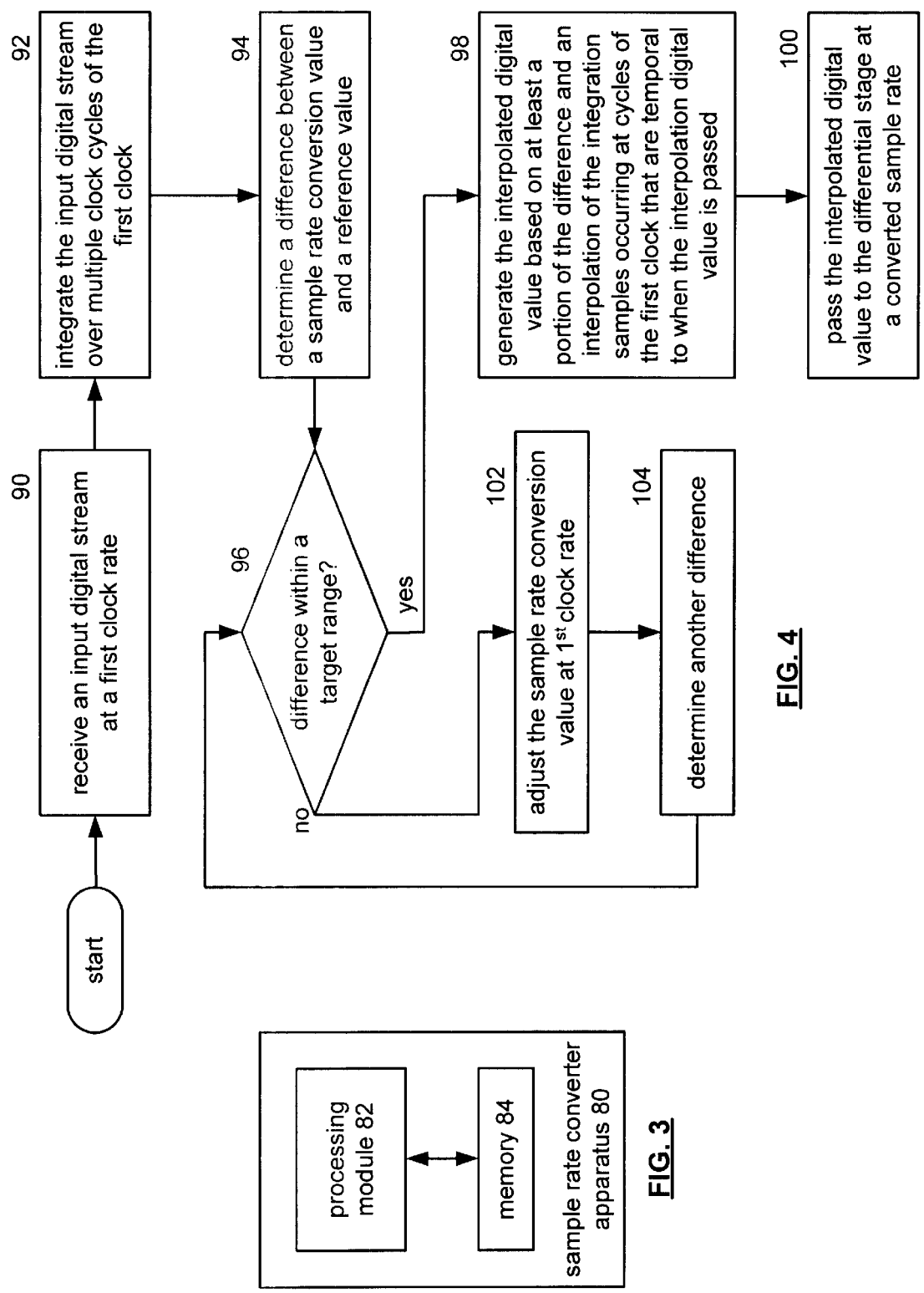

METHOD AND APPARATUS SAMPLE RATE CONVERSIONS IN AN ANALOG TO DIGITAL CONVERTER

TECHNICAL FIELD OF THE INVENTION

This invention relates generally to digital signal processing and more particularly to sample rate conversion in an analog to digital converter.

BACKGROUND OF THE INVENTION

In digital audio applications, an audio Codec (coder/decoder) is required to convert input analog audio signals into digital audio signals and to convert processed digital audio signals into output analog audio signals. Accordingly, the audio Codec includes an analog to digital converter (ADC) to convert the analog input audio signals into the digital signals and a digital to analog converter (DAC) to convert the processed digital signals into the analog output audio signals. The ADC and DAC may be implemented using a variety of topologies.

One implementation of an ADC includes a Sigma Delta modulator and a digital decimation filter. The Sigma Delta modulator is operably coupled to receive an analog input signal and to produce therefrom an oversampled digital signal. The digital decimation filter filters the oversampled digital signal at a rate that is a fraction (e.g., $\frac{1}{2}^n$) of the oversampling rate used by the Sigma Delta modulator to produce digital signals. Depending on the desired rate of the digital signals, the output of the decimation filter may be the output of the ADC or it may be further filtered. For an AC97 specification compliant audio Codec, the Codec includes a master clock that operates at a rate of 24.576 MHz, which is divided by a factor of n to produce the oversampling rate of the Sigma Delta modulator. For example, the oversampling rate may be 12.288 MHz (divide by 2) or 6.144 MHz (divide by 4). The decimation filter of an AC97 audio Codec may operate at a rate that is $\frac{1}{32}$nd of the oversampling rate. As such the decimation filter outputs a digital data stream at a rate of 384 KHz for a 12.288 MHz oversampling rate and at a rate of 192 KHz for a 6.144 MHz oversampling rate.

Current digital audio rates are specified, for various applications, to be 48 KHz, 44.1 KHz, 22.05 KHz, 16 KHz, 11.025 KHz or 8 KHz. To achieve the 48 KHz sampling rate, the output digital data stream of the decimation filter is further filtered at a rate that is a fraction of the rate used by the decimation filter. As such, to achieve the 48 KHz output, the decimation filter includes further filtering that reduces the 384 KHz rate by a factor of 8. To achieve the 48 KHz output stream when the oversampling rate is 6.144 MHz, the decimation filter may be adjusted to produce a 384 KHz data stream and the further filtering would be the same as just discussed. To achieve a 24 KHz output rate, the rate of the further filtering in the decimation filter rate is adjusted by a factor of two from the previous example. To obtain other output rates while maintaining the divide-by-8 in the further filtering, the rate of the decimation filter is changed. For example, if the output sample rate is 16 KHz, the decimation filter rate would be a divide by 96 for a 12.288 MHz oversampling rate and would be a divide by 48 for a 6.144 MHz.

The rates of 44.1 KHz, 22.05 KHz and 11.025 KHz cannot be directly obtained by dividing the master clock by an integer. To obtain such rates, sample rate conversion is needed. One known sample rate conversion technique determines an integer ratio between a $\frac{1}{2}^n$ multiplier rate and the desired rate. The numerator of the ratio is used to upscale the oversampling rate of the Sigma Delta modulator and the denominator of the ratio is used to divide the resultant to obtain the new oversampling rate. For example, assume that the $\frac{1}{2}^n$ multiplier rate corresponds to 48 KHz and the desired rate is 44.1 KHz. An integer ratio of N to M for 44.1 to 48, equals 147 to 160. For this example, the oversampling rate to produce a 48 KHz output is upscaled by 147. For an oversampling rate of 12.288 MHz, the upscaled rate is approximately 1.8 GHz. The converted oversampling rate equals 1.8 GHz divided by 160, which is approximately 11.29 MHz. With this converted oversampling rate, $\frac{1}{2}^n$ multipliers may be used to obtain the desired output rates.

While the above described implementation works, it is impractical for commercial grade audio codecs due to the costs associated with a 1.8 GHz clock. Therefore, a need exists for a sample rate conversion technique that is commercially viable for use in analog to digital converters.

BRIEF DESCRIPTION OF THE DRAWING

FIG. 3 illustrates a schematic block diagram of an alternate analog to digital converter in accordance with the present invention; and FIG. 4 illustrates a logic diagram of a method for sample rate conversion in an analog to digital converter in accordance with the present invention.

DETAILED DESCRIPTION OF A PREFERRED EMBODIMENT

Generally, the present invention provides a method and apparatus for sample rate conversion in an analog to digital converter. Such a method and apparatus include processing that begins by receiving an input digital stream at a first clock rate from an oversampling quantizer (e.g., a sigma delta modulator). The processing continues by integrating the input digital stream over multiple clock cycles at the first clock rate to produce an integrated digital signal. For example, the integrated digital signal may be the result of integrating the input digital stream approximately 32 cycles of the first clock rate. The processing continues by determining when an interpolated digital value of the integrated digital signal is to be passed to a differentiation stage based on a difference between a sample rate conversion value and a reference value. For example, the sample rate conversion value includes an integer portion and a fractional portion and the reference value is an integer. When the integer portion of the sample rate conversion value is less than the reference value, the interpolated digital value is to be passed. The processing continues by, when the difference is within a targeted range (e.g., between 0 and −1 or 1 and 0), generating the interpolated digital value based on at least a portion of the difference and an interpolation of integration samples of the integrated digital signal occurring at cycles of the first clock rate that are temporal to when the interpolated digital value is to be passed. The processing further continues by passing the interpolated digital value to the differentiation stage at a converted sample rate. With such a method and apparatus, a commercially viable analog to digital converter having sample rate conversion is obtained.

Figure 1:
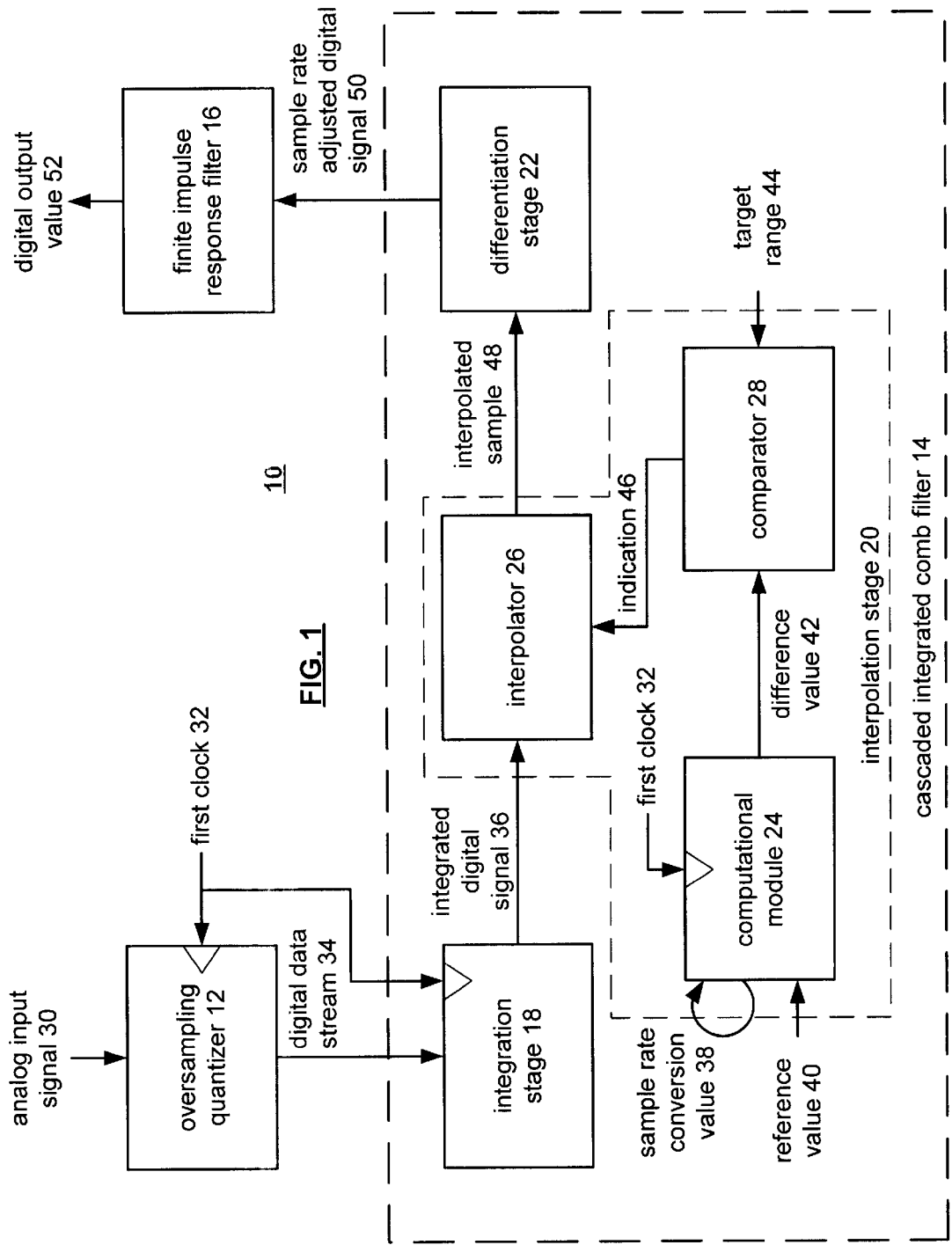
FIG. 1 illustrates a schematic block diagram of an analog to digital converter in accordance with the present invention.

The present invention can be more fully described with reference to FIGS. 1 through 4. FIG. 1 illustrates a schematic block diagram of an analog to digital converter (ADC) 10 that includes an oversampling quantizer 12, a cascaded integrated comb filter 14, and a finite impulse response (FIR) filter 16. The oversampling quantizer 12, which may be a sigma delta modulator, a mash converter, or other type of converter, receives an analog input signal 30 and produces a digital data stream 34 therefrom at the first clock rate 32. The first clock rate 32 corresponds to the oversampling rate of the oversampling quantizer 12. For example, if the ADC 12 is used in an AC97 audio codec, the oversampling rate may be 12.288 MHz or 6.144 MHz. The digital data stream 34 is a single bit data stream having a rate equal to the oversampling rate, where the data is either a +1 or a −1. As is known, a 50% 1's density (i.e., the digital data stream 34 includes approximately the same number of +1's as it does −1's) is representative of an analog input having a current magnitude of zero. As the magnitude of the analog input increases above zero, the 1's density of the digital data stream increases and, as the magnitude of the analog input decreases below zero, the 1's density decreases. As one of average skill in the art will appreciate, the oversampling quantizer 12 may produce a multi-bit digital data stream 34, but for ease of discussion, only a single-bit digital data stream will be discussed.

The cascaded integrated comb (CIC) filter 14 receives the digital data stream 34 and produces therefrom a sample rate adjusted digital signal 50. To produce the sample rate adjusted digital signal 50, the CIC filter 14 includes an integration stage 18, an interpolation stage 20, and a differentiation stage 22. The integration stage 18 is operably coupled to receive the digital data stream 34 and to integrate it at the first clock rate 32 to produce an integrated digital signal 36. The integration stage 18 may include a first order, second order, third order, or fourth order integrator.

The interpolation stage 20 includes a computational module 24, an interpolator 26, and a comparator 28. The computational module 24 decrements the sample rate conversion value 38 by one for each cycle of the first clock 32. After each decrement, the computational module 24 generates a difference value 42 based on the difference between the newly decremented sample rate conversion value 38 and the reference value 40. The comparator 28 compares the difference value 42 with a target range 44. When the difference value 42 is within the target range 44 (e.g., 0 to −1, or 1 to 0), the comparator 28 generates an indication 46, which causes the interpolator 26 to generate an interpolated sample 48 from the integrated digital signal 36. Once the indication 46 is sent, the computational module 24 resets the sample rate conversion value 38 using a ratio value that represents a ratio between a nominal sample rate and a desired sample rate.

When the difference value 42 is not within the target range 44, the computational module 24 decrements the sample rate conversion value 38 by one at an interval of the first clock 32. For example, assume that the desired sample rate of the digital output value 52 is 48 KHz, the FIR filter 18 decimates the frequency of the sample rate adjusted digital signal by eight, and the first clock 32 rate is 12.288 MHz. Further assume that the reset value is thirty-two, which is the ratio between the rate of the first clock 32 and the rate of the sample rate adjusted digital signal 50 (i.e., 12.288 MHz/384 KHz). For the generation of one interpolated sample 48, the sample rate conversion value 38 is reset by the reset value of thirty-two and the reference value 40 is set to be one. At the first interval of the first clock 32, the integration stage 18 integrates a first sample of the digital data stream 34 and the sample rate conversion value 30 (which is thirty-two) is compared with the reference value 40 (which is one). The difference value 42 is the difference between the current sample rate conversion value 30 less the reference value 38 (i.e., 32−1=31). The target range 44 for this example is set to be one to zero. Since the difference value 42 is not within the target range 44, the indication 46 is not set. At the next clock interval of the first clock 32, the integration stage 18 integrates the next sample of the digital data stream 34 along with the previous integrated digital signal 36. Also, at the next clock interval, the sample rate conversion value 38 is decremented by one and a new difference value 42 is generated (i.e., 31−1=30). The new difference value 42 is compared with the target range 44 and, since the new value is not within the target range 44, the indication 46 is not set.

The process of integrating the next sample of the digital data stream 34 with a current accumulated integrated digital signal 36 and generating a new difference value, continues as described in the preceding paragraph until the newly generated difference value 42 is within the target range 44. As such, thirty-two samples of the digital data stream 34 will be integrated by the integration stage 18, and the sample rate conversion value 38 will be decremented 32 times until it equals 1. At this point, the indication 46 is set, such that the interpolator 26 generates the interpolated sample 48 from the integrated digital signal 36. Note that, the desired sample rate of the digital output value 52, which, in this example, is 48 KHz and the FIR filter 16 decimates the frequency of the sample rate adjusted digital signal 50 by a factor of eight such that the rate of the sample rate adjusted digital signal 50 is 384 KHz. Accordingly, the CIC filter 14 needs to decimate the rate of the digital data stream 34 by the integer value of thirty-two. Thus, the sample rate conversion value 38, for this example, will have only an integer component and not a fractional component and the interpolator 26 utilizes the resulting integrated digital signal 36, without interpolation, as the interpolated sample 48.

As an additional example, assume that the desired sample rate of the digital output value 52 is 44.1 KHz, the FIR filter 16 decimates the rate of the sample rate adjusted digital signal 50 by eight, and the sample rate of the digital data stream 34 is 12.288 MHz. In this example, the rate of the sample rate adjusted digital signal 50 should be 352.8 KHz, which represents the product of 44.1 KHz times 8. Accordingly, the CIC filter 34 must decimate the rate of the digital data stream 34 to the rate of the sample rate adjusted digital signal 50, which requires a decimation of 34.83 (i.e., 12.288 MHz/352.8 KHz). Thus, for this example, the reset value is 34.83, which is the initial value of the sample rate conversion value 38. As intervals of the first clock 32 pass, the sample rate conversion value 38 is decremented by one and new difference values 42 are created as a difference between the sample rate conversion value 38 and the reference value 40, which, for this example, is one. Each of the newly created difference values 42 are compared with the target range 44, which for this example is a range of 0 to 1. When the difference value 42 is within the target range 44, the indication 46 is set and the interpolator 26 generates the interpolated sample 48 by interpolating integrated digital signals 36 based on a fractional component of the difference value. Note that the integrated digital signals 36 used to produce the interpolated sample 48 occur at cycles of the first clock 32 that are temporal to when the difference value is within the target range, which, on average, occurs every 34.83 cycles of the first clock 32.

As previously stated, the sample rate conversion value 38 was initially set at 34.83. As the sample rate conversion value 38 is decremented by one, the integer component changes but the fractional component (i.e., the 0.83) remains unchanged. Thus, for an interpolation for this example, the interpolator 26 uses the fractional component of 0.83 to interpolate the consecutive integrated digital signals 36 using a first order interpolation, a second order interpolation, or a greater order interpolation to generate the interpolated sample 48. Once the interpolated sample 48 is generated, the sample rate conversion value 38 is reset by adding the reset value of 34.83 to the current sample rate conversion value 38 of 0.83. Thus, for the next production of an interpolated sample 48, the initial sample rate conversion value 38 is 35.66 (i.e., 34.83+0.83).

With the new sample rate conversion value 38 of 35.66, thirty-five cycles of the first clock 32 will pass before the interpolated sample 48 is produced. At this point, the sample rate conversion value 38 is again reset by adding 34.83 to the current sample rate conversion value of 0.66, which yields the new sample rate conversion value 38 of 35.49. As one of average skill in the art will appreciate, other digital output value 52 sample rates may be readily produced using the ADC 10 of FIG. 1. In addition, other rates of the first clock 32 may be used in the ADC 10 of FIG. 1. For example, assume that the desired sample rate of the digital output value 52 is 24 KHz and the rate of the first clock 32 is 12.288 MHz. In this example, the reset value is 64 since the FIR filter decimates the rate of the sample rate adjusted digital 50 by a factor of 8 (i.e., reset rate =12.288 MHz/(24 KHz*8)). In general, the reset value is based on the equation:

Reset value=(rate of first clock)/((desired rate of digital output)*(FIR decimation rate)).

Figure 2:
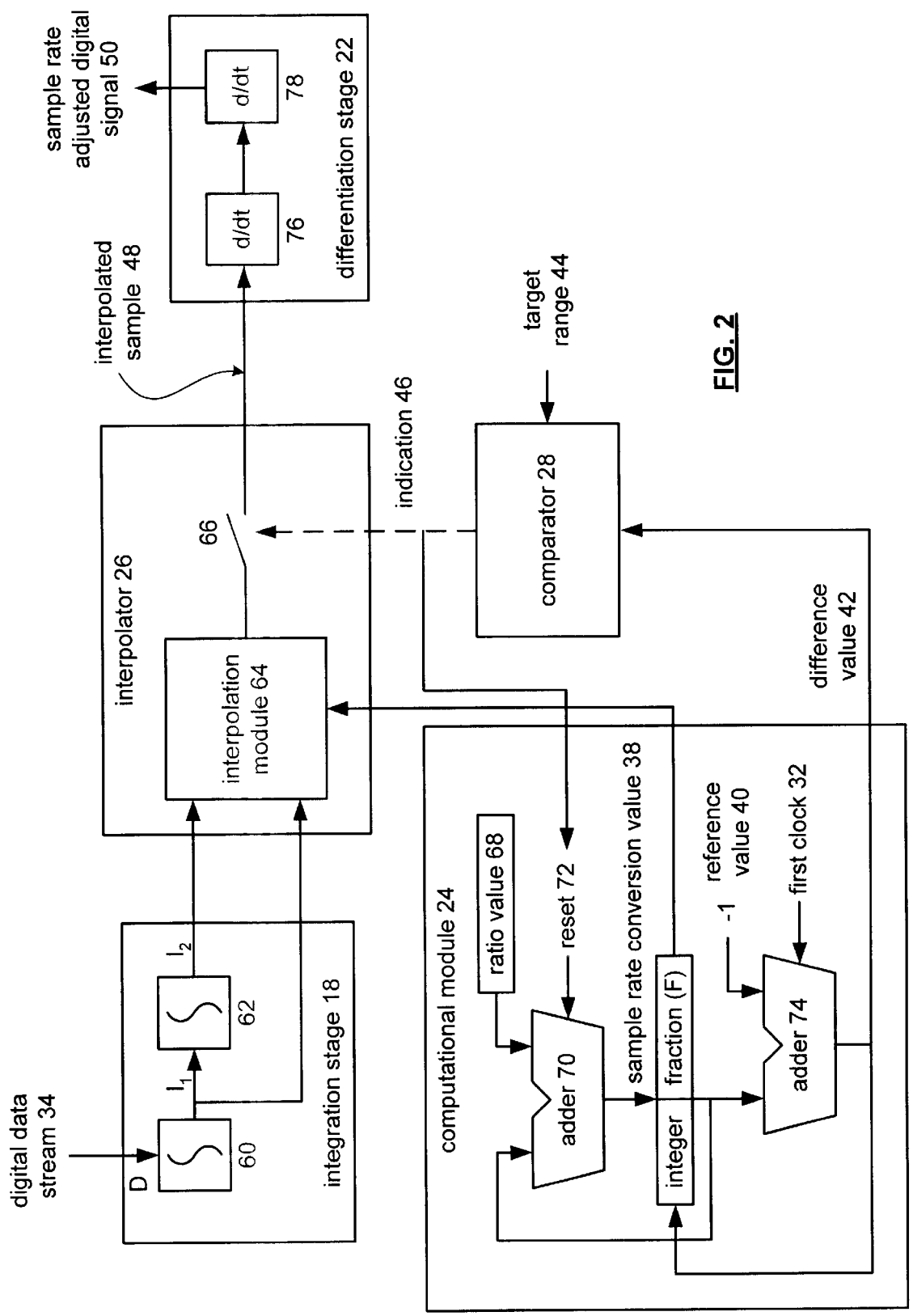
FIG. 2 illustrates a schematic block diagram of a cascaded integrated comb filter that may be used in an analog to digital converter in accordance with the present invention.

FIG. 2 illustrates a schematic block diagram of CIC filter 14, which includes the integration stage 18, the interpolator 26, the computational module 24, the comparator 28, and the differentiation stage 22. The integration stage 18 is shown as a second order integrator including a first integration stage 60 and a second integration stage 62. The first integration stage 60 is operably coupled to receive data samples (D) from the digital data stream 34 at the rate of the first clock. The first integration stage 60 integrates the data samples (D) to produce a first stage integration sample $I_1$. The second integration stage 62 receives the first stage integration sample $I_1$ and integrates it to produce a second stage integration sample $I_2$. As one of average skill in the art will appreciate, the integration stage 18 may include more or less than two integrators.

The interpolator 26 is shown to include an interpolation module 64 and a switching element 66. The switching element 66 is gated by the indication 46 such that when the indication is activated, the switching element 66 is closed and the interpolated sample 48 is provided to the differentiation stage 22. The switching element 66 may be implemented as a switch, a gateable logic circuit, or any circuit that provides a low impedance path when the indication 46 is activated and a high impedance (e.g., an open) when the indication 46 is inactivate.

The interpolation module 64 performs a first order, second order, or multiple order interpolation on the first and second integration samples $I_1$ and $I_2$. A first order, or linear, interpolation is accomplished using the equation:

$$I_{2interpolated}=I_{2previous}+(I_{1previous}+D_{current})*\text{Fraction}$$

where $I_{2interpolated}$ represents the interpolated sample 48, $I_{2previous}$ represents the output of the second integration stage 62 at the preceding clock cycle of the first clock 32, $I_{1previous}$ represents the output of the first integration stage 60 at the preceding clock cycle of the first clock 32, $D_{current}$ represents the data sample of the digital data stream 34 at the current clock cycle of the first clock 32, and Fraction represents the fractional component of the sample rate conversion value 38. The current clock cycle corresponds to the clock cycle at which the difference value 42 is within the target range 44.

The interpolation module 64 may perform a second order interpolation by using the equation:

$$I_{2interpolated}=I_{2previous}+(I_{1previous}+D_{current}*(2+\text{Fraction})/2)*\text{Fraction}$$

where $I_{2interpolated}$ represents the interpolated sample 48, $I_{2previous}$ represents the output of the second integration stage 62 at the preceding clock cycle of the first clock 32, $I_{1previous}$ represents the output of the first integration stage 60 at the preceding clock cycle of the first clock 32, $D_{current}$ represents the data sample of the digital data stream 34 at the current clock cycle of the first clock 32, and Fraction represents the fractional component of the sample rate conversion value 38. Note that the differentiation stage 22 may include more or less than two differentiations stages, but will generally contain the same number of stages as the number of integration stages in the integration stage 18.

The interpolated sample 48 is passed to the differentiation stage 22 when the indication 46 is active. The differentiation stage includes a first differentiation stage 76 and a second differentiation stage 78. The first differentiation stage 76 differentiates the interpolated sample 48 to produce a first differentiated sample. The second differentiation stage 78 differentiates the first differentiated sample to produce the sample rate adjusted digital signal 50.

The computational module 24 includes a ratio value register 68, an adder 70, and a second adder 74. The second adder 74 adds the reference value 40 to the current sample rate conversion value 38 at intervals of the first clock 32. As shown, the reference value 40 is negative one. For each decrement of the sample rate conversion value 38, it is stored in a register having an integer portion and a fractional portion. On the next cycle of the first clock 32, the then current sample rate conversion value is decremented and the new value is stored in the sample rate conversion value register. This continues until a reset signal 72 is received.

The reset signal 72 may be triggered from the indication 46, which causes the adder 70 to add the then current sample rate conversion value 38 with the ratio value 68. As previously discussed, the ratio value is based on the decimation that is required to be performed by the CIC filter 14. For example, if the first clock rate is 12.288 MHz and the desired rate of the sample rate adjusted digital signal 50 is 384 KHz, then the ratio value is 32. As another example, if the first clock rate is 12.288 MHz and the desired rate of the sample rate adjusted digital signal 50 is 352.8 KHz, then the ratio value is 34.83.

FIG. 3 illustrates a schematic block diagram of a sample rate converter apparatus 80 that includes a processing module 82 and memory 84. The processing module 82 may be a single processing device or a plurality of processing devices. Such a processing device may be a microprocessor, micro-controller, micro-computer, central processing unit, co-processor, digital signal processor, state machine, logic circuitry, and/or any device that manipulates signals (analog or digital) based on operational instructions. The memory 84 may be a single memory device or a plurality of memory devices. Such a memory device may be RAM, ROM, flash memory, floppy disk memory, system memory, or any device that stores digital information. Note that when the processing module 82 implements one or more of its functions via a state machine or logic circuitry, the memory storing the corresponding operational instructions is embedded within the circuitry comprising the state machine or logic circuitry. The operational instructions stored in memory 84 and executed by processing module 82 are described in FIG. 4.

FIG. 4 illustrates a logic diagram of a method for sample rate conversion in an analog to digital converter. The process begins at step 90 where an input digital stream of data is received at a first clock rate. The process proceeds to step 92 where samples of the input digital stream of data are integrated over multiple clock cycles of the first clock. The number of clock cycles over which the input is integrated depends on the decimation rate of the CIC filter. The process then proceeds to step 94 where a difference between a sample rate conversion value and a reference value is determined. The process then proceeds to step 96 where a determination is made to determine whether the difference value is within a target range. If not, the process proceeds to step 102 where the sample rate conversion value is adjusted at the first clock rate. The sample rate conversion value may be adjusted by decrementing it by one for each integration cycle. The process then proceeds to step 104 where another difference value is determined. The process then repeats at step 96 until the difference value is within the target range.

When the difference value is within the target range, the process proceeds to step 98. At step 98, the interpolated digital value is determined based on at least a portion of the difference value and an interpolation of the integration samples occurring at cycles of the first clock that are temporal to when the interpolated digital value is to be passed to the differentiation stage of the CIC filter. The interpolation may be done using a linear interpolation or a multiple order interpolation. A linear interpolation may based on the equation $I_{2I}=I_{2p}+(I_{1p}+D_c)*F$, where the $I_{2I}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference. A second order interpolation may be based on the equation $I_{2I}=I_{2p}+(I_{1p}+D_c*(1+F)/2)*F$, where the $I_{2I}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference.

The process then proceeds to step 100 where the interpolated digital value is passed to the differentiation stage at converted sample rate. Once the interpolated digital value is passed, or contemporaneously thereto, the sample rate conversion value is reset. This may be done by adding a ratio value to the current sample rate conversion value, where the ratio value represents a ratio between a nominal sample rate and a desired sample rate.

The preceding discussion has presented a method and apparatus for commercially viable sample rate conversion in an analog to digital converter. Such an analog to digital converter may be used in an audio codec that is required to process multiple audio formats. As one of average skill in the art will appreciate, other embodiments may be derived from the present teachings without deviating from the scope of the claims.

What is claimed is:

1. A method for sample rate conversion, the method comprises the steps of:
   a) receiving an input digital stream at a first clock rate;
   b) integrating the input digital stream over multiple clock cycles at the first clock rate to produce an integrated digital signal;
   c) determining when an interpolated digital value of the integrated digital signal is to be passed to a differentiation stage based on a difference between a sample rate conversion value and a reference value;
   d) when the difference is within a targeted range, generating the interpolated digital value based on at least a portion of the difference and an interpolation of integration samples of the integrated digital signal occurring at cycles of the first clock rate that are temporal to when the interpolated digital value is to be passed; and
   e) passing the interpolated digital value to the differentiation stage at a converted sample rate.

2. The method of claim 1, wherein step c) further comprises:
   when the difference is not within the targeted range, adjusting the sample rate conversion value;
   determining another difference between the adjusted sample rate conversion value and the reference value;
   when the another difference is within the targeted range, generating the interpolated digital value based on at least a portion of the another difference and an interpolation of integration samples of the integrated digital signal occurring at the cycles of the first clock rate that are temporal to when the interpolated digital value is to be passed.

3. The method of claim 2 further comprises:
   adjusting the sample rate conversion value by decrementing the sample rate conversion value by one for each integration cycle.

4. The method of claim 1 further comprises:
   when the difference is within the targeted range, resetting the sample rate conversion value by adding a ratio value that represents a ratio between a nominal sample rate and a desired sample rate.

5. The method of claim 1, wherein step c) further comprises:
   determining the difference between the sample rate conversion value and the reference value, wherein the reference value is zero, wherein the sample rate conversion value represents a ratio between a nominal sample rate and a desired sample rate and wherein the targeted range is between zero to negative one or zero to positive one.

6. The method of claim 1, wherein step (d) further comprises:
   linearly interpolating the integration samples to produce the interpolated digital value.

7. The method of claim 6, wherein step (b) further comprises:
   integrating the input digital stream by a second order integrator, wherein the linearly interpolating is based on the equation $I_{2I}=I_{2p}+(I_{1p}+D_c)*F$, where the $I_{2I}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference.

8. The method of claim 1, wherein step (d) further comprises:
utilizing a second order interpolation on the integration samples to produce the interpolated digital value.

9. The method of claim 8, wherein step (b) further comprises:
integrating the input digital stream by a second order integrator, wherein the second order interpolation is based on the equation $I_{2I}=I_{2p}+(I_{1p}+D_c*(1+F)/2)*F$, where the $I_{2I}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference.

10. An apparatus for sample rate conversion, the apparatus comprises:
a processing module; and
memory operably coupled to the processing module, wherein the memory includes operational instructions that cause the processing module to: (a) receive an input digital stream at a first clock rate; (b) integrate the input digital stream over multiple clock cycles at the first clock rate to produce an integrated digital signal; (c) determine when an interpolated digital value of the integrated digital signal is to be passed to a differentiation stage based on a difference between a sample rate conversion value and a reference value; (d) when the difference is within a targeted range, generate the interpolated digital value based on at least a portion of the difference and an interpolation of integration samples of the integrated digital signal occurring at cycles of the first clock rate that are temporal to when the interpolated digital value is to be passed; and (e) pass the interpolated digital value to the differentiation stage at a converted sample rate.

11. The apparatus of claim 10, wherein the memory further comprises operational instructions that cause the processing module to:
when the difference is not within the targeted range, adjust the sample rate conversion value;
determine another difference between the adjusted sample rate conversion value and the reference value;
when the another difference is within the targeted range, generate the interpolated digital value based on at least a portion of the another difference and an interpolation of integration samples of the integrated digital signal occurring at the cycles of the first clock rate that are temporal to when the interpolated digital value is to be passed.

12. The apparatus of claim 11, wherein the memory further comprises operational instructions that cause the processing module to:
adjust the sample rate conversion value by decrementing the sample rate conversion value by one for each integration cycle.

13. The apparatus of claim 10, wherein the memory further comprises operational instructions that cause the processing module to:
when the difference is within the targeted range, reset the sample rate conversion value by adding a ratio value that represents a ratio between a nominal sample rate and a desired sample rate.

14. The apparatus of claim 10, wherein the memory further comprises operational instructions that cause the processing module to:
determine the difference between the sample rate conversion value and the reference value, wherein the reference value is zero, wherein the sample rate conversion value represents a ratio between a nominal sample rate and a desired sample rate and wherein the targeted range is between zero to negative one or zero to positive one.

15. The apparatus of claim 10, wherein the memory further comprises operational instructions that cause the processing module to:
linearly interpolate the integration samples to produce the interpolated digital value.

16. The apparatus of claim 15, wherein the memory further comprises operational instructions that cause the processing module to:
integrate the input digital stream by a second order integrator, wherein the linearly interpolating is based on the equation $I_{2I}=I_{2p}+(I_{1p}+D_c)*F$, where the $I_{2I}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference.

17. The apparatus of claim 10, wherein the memory further comprises operational instructions that cause the processing module to:
utilize a second order interpolation on the integration samples to produce the interpolated digital value.

18. The apparatus of claim 10, wherein the memory further comprises operational instructions that cause the processing module to:
integrate the input digital stream by a second order integrator, wherein the second order interpolation is based on the equation $I_{2I}=I_{2p}+(I_{1p}+D_c*(1+F)/2)*F$, where the $I_{21}$ represents the interpolated digital value, where the $I_{2p}$ represents a previous integrated sample from a second stage of the second order integrator, where the $I_{1p}$ represents a previous integrated sample from a first stage of the second order integrator, where the $D_c$ represents a current data sample of the input data stream, and where the F represents the at least a portion of the difference.

19. An analog to digital converter comprises:
an oversampling quantizer operably coupled to receive an analog input signal to produce therefrom a digital data stream;
a cascaded integrated comb filter operably coupled to receive the digital data stream and to produce therefrom a sample rate adjusted digital signal, wherein the cascaded integrated comb filter includes:
an integration stage operably coupled to receive the digital data stream and to produce an integrated digital signal by integrating the input digital stream over multiple clock cycles of a first clock;
a differentiation stage operably coupled to receive an interpolated sample of the integrated digital signal and to produce therefrom the sample rate adjusted digital signal;
an interpolation stage operably coupled to receive the integrated digital signal and to produce therefrom the interpolated sample, wherein the interpolation stage includes:

a computational module operably coupled to produce a difference value as a difference between a sample rate conversion value and a reference value, wherein the difference value is produced at cycles of the first clock;

a comparator operably coupled to indicate when the difference value is within a target range;

an interpolator operably coupled to produce the interpolation sample from integration samples of the integrated digital signal at cycles of the first clock when the comparator indicates that the difference value is within the target range;

a finite impulse response filter operably coupled to receive the sample rate adjusted digital signal and to produce therefrom a digital output value.

20. The analog to digital converter of claim 19, wherein the computational module further comprises:

a reset module operably coupled to reset the difference value by adding a ratio value that represents a ratio between a nominal sample rate and a desired sample rate.

21. The analog to digital converter of claim 19, wherein the interpolator further comprises:

a linear interpolation module operably coupled to linearly interpolate the integration samples to produce the interpolated digital value.

22. The analog to digital converter of claim 21, wherein the integration stage further comprises:

a first integration stage operably coupled to integrate a sample of the digital data stream to produce a first stage integrated sample;

a second integration stage operably coupled to integrate the first stage integrated sample to produce a second stage integrated sample;

wherein the linearly interpolating is based on the equation $I_{2I}=I_{2p}+(I_{1p}+D_c)*F$, where the $I_{2I}$ represents the interpolated digital value, where the $I_{2p}$ represents a previous integrated sample from the second integration stage, where the $I_{1p}$ represents a previous integrated sample from the first integration stage, where the $D_c$ represents a current data sample of the input data stream, and where the F represents the at least a portion of the difference.

23. The analog to digital converter of claim 19, wherein the interpolator further comprises:

a non-linear interpolation module operably coupled to interpolate, by at least a second order interpolation, the integration samples to produce the interpolated digital value.

24. The analog to digital converter of claim 23, wherein the integration stage further comprises:

a first integration stage operably coupled to integrate a sample of the digital data stream to produce a first stage integrated sample;

a second integration stage operably coupled to integrate the first stage integrated sample to produce a second stage integrated sample;

wherein the non-linear interpolation is based on the equation $I_{2I}=I_{2p}+(I_{1p}+D_c*(1+F)/2)*F$, where the $I_{2I}$ represents the interpolated digital value, where the $I_{2p}$ represents a previous integrated sample from the second integration stage, where the $I_{1p}$ represents a previous integrated sample from the first integration stage, where the $D_c$ represents a current data sample of the input data stream, and where the F represents the at least a portion of the difference.

* * * * *